United States Patent [19]

Teggatz

[11] Patent Number: 5,786,724

[45] Date of Patent: Jul. 28, 1998

[54] CONTROL OF BODY EFFECT IN MOS TRANSISTORS BY SWITCHING SOURCE-TO-BODY BIAS

[75] Inventor: Ross E. Teggatz, McKinney, Tex.

[73] Assignee: Texas Instruments Incorporated

[21] Appl. No.: 768,876

[22] Filed: Dec. 17, 1996

[51] Int. Cl.[6] .................................................. H03K 5/003
[52] U.S. Cl. ...................... 327/534; 327/333; 327/543; 327/546
[58] Field of Search ................................. 327/333, 534, 327/537, 538, 543, 545, 546

[56] References Cited

U.S. PATENT DOCUMENTS

| | | | |
|---|---|---|---|
| 3,916,430 | 10/1975 | Heuner et al. | 327/333 |
| 3,976,984 | 8/1976 | Hirasawa | 327/333 |
| 5,552,723 | 9/1996 | Shigehara et al. | 327/534 |

*Primary Examiner*—Gene M. Munson
*Attorney, Agent, or Firm*—Warren L. Franz; Wade James Brady, III; Richard L. Donaldson

[57] ABSTRACT

A voltage level shifting circuit (FIG. 4) has a plurality of PMOS transistors $M_1$, $M_2$, $M_3$ connected in parallel for respectively driving a capacitive load $C_L$ with a selected different voltage level $V_1$, $V_2$ or $V_3$. Transistors $M_1$, $M_2$, $M_3$ are controlled so that one of them is placed in the ON condition, with the others in the OFF condition, to connect one of the voltages $V_1$, $V_2$ or $V_3$ to charge the load CL. The largest voltage transistor $M_3$ has its body connected to its source. The lower voltage transistors $M_1$, $M_2$ have their bodies respectively connected to switches $S_1$, $S_2$, which connect the bodies to the sources when the transistors are placed in the ON condition and connect the bodies to the highest voltage $V_3$ when the transistors are placed in the OFF condition.

7 Claims, 2 Drawing Sheets

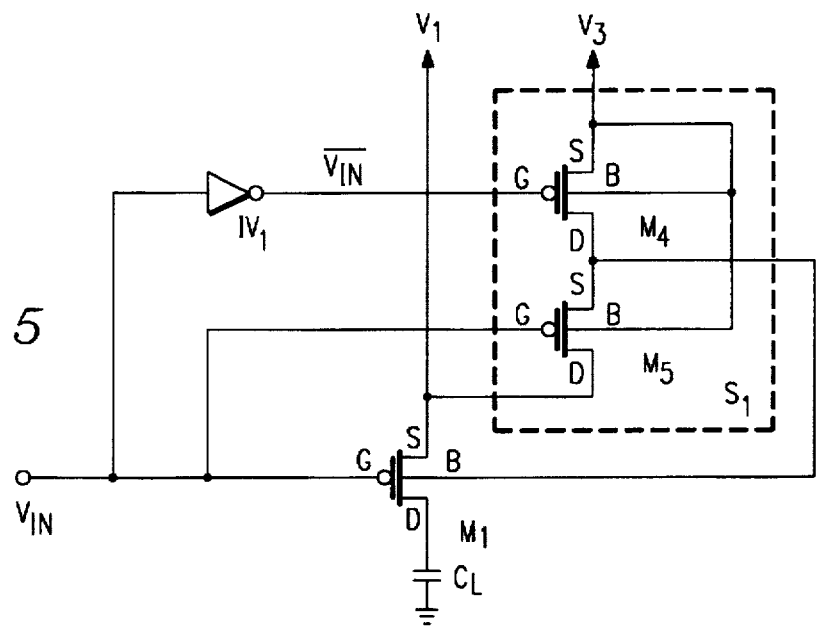
FIG. 5
FIG. 6
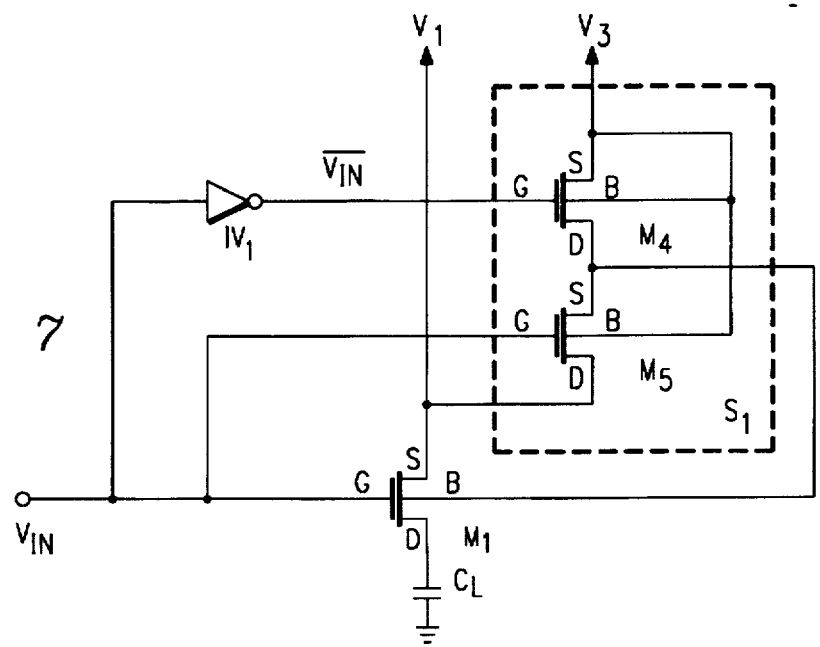
FIG. 7

CONTROL OF BODY EFFECT IN MOS TRANSISTORS BY SWITCHING SOURCE-TO-BODY BIAS

This invention relates to MOS transistor circuits, in general; and, in particular, to apparatus and methods for biasing MOS transistors used in such circuits.

BACKGROUND OF THE INVENTION

In a metal-oxide semiconductor field-effect transistor (MOSFET), a thin dielectric barrier is used to isolate the gate and the channel. The voltage applied to the gate induces an electric field across the dielectric barrier to control the free-carrier concentration in the channel region. Such devices are referred to as insulated-gate field-effect transistors (IGFETs), or simply as MOS transistors. A. Grebene, *Bipolar and MOS Analog Integrated Circuit Design* (1984 J. Wiley & Sons) 106. It should be noted that the term MOS applies even though the gate may be a non-metallic conductor, such as a highly doped polysilicon.

MOS transistors are classified as P-channel or N-channel devices, depending on the conductivity type of the channel region. In addition, they can also be classified as "enhancement" or "depletion" devices. In a depletion-type MOSFET, a conducting channel exists under the gate when no gate voltage is applied. The applied gate voltage controls the current flow between the source and the drain by depleting a part of this channel. In an enhancement-type MOS transistor, no conductive channel exists between the source and the drain at zero applied drain voltage. As a gate bias of proper polarity is applied and increased beyond a threshold value $V_T$, a localized inversion layer is formed directly below the gate. This inversion layer serves as a conducting channel between the source and the drain electrodes. If the gate bias is increased further, the resistivity of the induced channel is reduced, and the current conduction from the source to the drain is enhanced. Id at 106–107.

MOS transistors make good switches because (1) when the device is ON and conducting, there is no inherent dc offset voltage between the source and drain, and (2) the control terminal (the gate) is electrically isolated from the signal path, thus no dc current flows between the control path and the signal path. Id at 303.

Normally, all the active regions of the MOSFET are reverse-biased with respect to the substrate. Thus, adjacent devices fabricated on the same substrate are electrically isolated without requiring separate isolation diffusions. The bulk of the semiconductor region is normally inactive since the current flow is confined to a thin surface channel directly below the gate. The bulk of the MOS transistor is called the "body" or "back gate" and, for efficient operation, is normally tied to the same potential as the source. Id at 108. In certain circuits, such as the conventional voltage level shifting circuits discussed below, however, it may be necessary to apply a different potential to the body in order to maintain the source-body junction in reverse biased condition and prevent a large junction current from flowing inside the transistor. Such current will interfere with normal circuit operation and can permanently damage the device or circuit.

Thus, for an N-channel MOS (NMOS) transistor the body (or bulk) must be biased to make it negative with respect to both source and drain, and for a P-channel MOS (PMOS) transistor the body must be biased to make it positive with respect to both source and drain. In a depletion device, if the reverse voltage $V_{SB}=V_S-V_B$ between the body and the source (and hence the channel) is increased, the depletion region around the channel will become wider. This will increase the minimum gate voltage $V_G=V_T$ necessary to maintain the depletion region without creating a conductive channel. In an enhancement device, on the other hand, increasing the reverse voltage will narrow the enhancement region, raising the voltage $V_G=V_T$ needed to develop the enhancement region to create the channel. This dependence of $V_T$ on the magnitude of the reverse biasing voltage $V_{SB}$ is known as the "body effect." In addition to increasing the magnitude of the threshold $V_T$, another undesired result of the body effect is to reduce the device transconductance and the output impedance when the device is operated in a cascode configuration. The body effect phenomenon is a major limitation of MOS devices operated at $V_S \neq V_B$. See, Id at 268–271; and R. Gregorian, et al., *Analog MOS Integrated Circuits for Signal Processing* (1986 J. Wiley & Sons) 77–78.

FIG. 1A illustrates a typical MOS transistor with its substrate body tied to its source potential. Such arrangement, shown for a PMOS transistor in FIG. 1A, is equivalent to a PN diode connection between a drain and source, as shown in FIG. 1B. A $V_B=V_S$ connection is usually effective to reverse-bias the PN junction and, because it minimizes the threshold voltage $V_T$, results in efficient operation and minimum area requirements (viz. channel length and width) for the device. Also, such connections provide relatively uniform resistivity for variations in applied voltage V+ in multiple MOS transistor layouts. Body-to-source reverse biasing will not, however, work for circuits wherein the MOS device will be subjected to varying voltages, sometimes placing the drain voltage $V_D$ at a forward biasing potential relative to the source. This is so for a circuit wherein distinct MOS switches are connected in parallel to drive a capacitive load with a selected one of a number of different voltages. An example of such a driver arrangement exists in a matrix-addressable flat-panel display column driver, in which different MOS transistors are used to apply a selected one of different voltages to a display column, such as for gray scale control of imaging pixels. In such a voltage level shifter arrangement, the requirement for maintaining a reverse bias across the body diode junction prevents tying the body to the source. This is because any voltage applied to the capacitive load, except the lowest one, will forward bias the other body diodes, preventing charge of the load.

This limitation can be seen by examination of the operation of a conventional voltage level shifting circuit shown of FIG. 2, wherein a plurality of PMOS transistors $M_1$, $M_2$, $M_3$ are connected in parallel, for respectively driving a capacitive load $C_L$ with a selected different voltage level $V_1$ (e.g., 5 volts), $V_2$ (e.g., 10 volts), or $V_3$ (e.g., 20 volts). If a control voltage $V_G \geq V_T$ is applied to place transistor $M_1$ in the ON condition (with transistor $M_2$, $M_3$ in the OFF condition), voltage $V_1$ (5 volts) will be applied across the load $C_L$ and also to the drains of transistors $M_2$, $M_3$. Because the sources of transistors $M_2$, $M_3$ are at higher potentials, this does not pose a forward biasing problem for the PN junctions of $M_2$, $M_3$. The voltage differential $V_{DS}$ for $M_2$ would be $V_1-V_2=-5$ volts; and for $M_3$ would be $V_1-V_3=-15$ volts. So, even with $V_{BS}=0$, the body diodes of $M_2$, $M_3$ would be reverse biased, and the voltage $V_1$ would be applied to charge the load $C_L$. This would not be the case, however, if one of the transistors $M_2$ or $M_3$ were placed in the ON condition. If transistor $M_2$ were ON (with transistors $M_1$, $M_3$ OFF), the $V_2$ (10 volts) would be applied to the drains of $M_1$, $M_3$. This would leave $M_3$ with a reverse biased body diode ($V_{DS3}=V_2-V_1=-10$ volts), but would forward bias the body diode of $M_1$ ($V_{DS1}=V_2-V_1=5$ volts). Thus, current would flow in the body of $M_1$ for the $M_1$ OFF condition, preventing charge-up of load $C_L$. For $M_3$ in the ON condition (with $M_1$ and $M_2$ OFF), both $M_1$ and $M_2$ would have forward biased body diodes and current flowing through their bodies would prevent charge-up of load $C_L$.

To overcome this problem, the bodies or "back gates" of transistors $M_1$, $M_2$ connected to lower voltages $V_1$, $V_2$ are connected to a voltage $V_B \geq V_S$ in order to maintain the reverse biased condition. The greater source-to-body bias $V_{SB}$ will, however, increase the body effect for the transistors $M_1$, $M_2$ connected to apply the lower voltages $V_1$, $V_2$, and the gain of those devices will be decreased. Thus, because the channel-ON resistance $R_{DSON}$ directly correlates to the gain, in order to achieve the same target $R_{DSON}$, the MOS structures $M_1$, $M_2$ with the larger body effects will require more area or "footprint". So, all MOS switches except the one tied to the largest voltage, must be made larger to accommodate the larger higher voltage differentials. Higher potential difference between the body and the source will also dramatically reduce the efficiency of the operation of the device. Moreover, uniformity of the respective resistances $R_{DSON}$ between the different devices will be reduced, giving less control over the saturation current point, with the risk of putting the power supply under greater burden due to transients.

It is, therefore, an object of the present invention to overcome the forward biasing problem in voltage level shifters and other circuits which subject MOS devices to different voltage levels, without the need to use larger MOS transistors to compensate for the body effect.

SUMMARY OF THE INVENTION

The invention provides control of the body effect in MOS transistors, without the need to increase their areas, by switching the source-to-body bias from one voltage to another when the transistor goes between channel current flow ON and OFF conditions. In accordance with a preferred embodiment, a MOS transistor used to selectively connect a voltage to a load has its body connected to its source during the ON condition, and its body connected to another voltage potential to maintain reverse bias during the OFF condition.

For an illustrative voltage level shifter application, described in greater detail below, a plurality of MOS transistors are connected in parallel to act as switches for selective connection of respective different voltage sources to a capacitive load. Auxiliary switches are provided to connect the body of each main switch, either to its source when it is in the ON condition or to the highest one of the applied voltages when it is in the OFF condition. For a PMOS implementation, the body is connected to the source and the drain is tied to ground when the switch is ON, but when the switch is OFF the body and the gate are both connected to the highest voltage.

BRIEF DESCRIPTION OF THE DRAWINGS

Embodiments of the invention have been chosen for purposes of illustration and description, and are shown with reference to the accompanying drawings, wherein:

FIG. 5 is a schematic view of a specific implementation of an auxiliary switch for the embodiment of FIG. 4; and FIGS. 6 and 7 are schematic views of an NMOS configuration of the circuit of FIGS. 4 and 5.

Throughout the drawings, like elements are referred to by like numerals.

DETAILED DESCRIPTION OF THE PREFERRED EMBODIMENTS

Figure 3A:
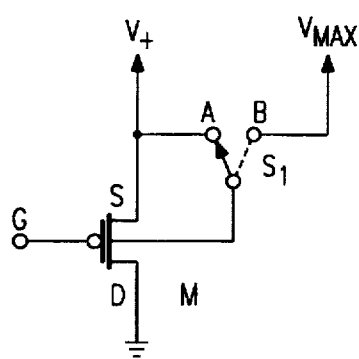
FIG. 3A is a schematic view of a MOS transistor with switched source-to-body bias in accordance with the principles of the invention.

For simplicity in understanding the principles of the invention, FIG. 3A shows a simplified schematic rendition of a MOS transistor employing switching of source-to-body bias in accordance with the invention. The illustrated embodiment utilizes PMOS transistors of the enhancement type. However, those skilled in the art to which the invention relates will appreciate that the same principles apply to NMOS transistors and to MOS transistors of the depletion type, and that the principles applied to the shown PMOS enhancement structure can be readily extended to their NMOS and depletion MOS equivalents.

Figure 1A:
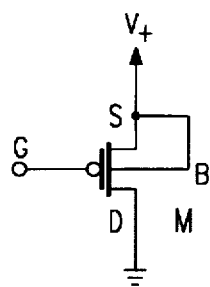
FIG. 1A is a schematic view of a MOS transistor with its body connected to its source.
Figure 1B:
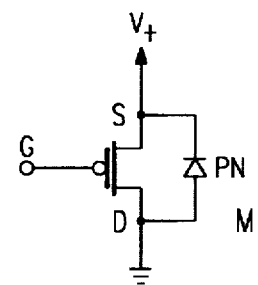
FIG. 1B is a schematic view of an equivalent circuit to the MOS transistor of FIG. 1A.

In FIG. 3A, transistor M is connected in its ON condition, as in FIG. 1A, with its drain connected to ground and its body connected to its source. The equivalent structure is shown in FIG. 3B, wherein the PN junction between the drain and body is shown as a diode PN connected between the drain and source. This arrangement is satisfactory and provides efficient operation, so long as the source-to-body connection $V_{SB}=0$ maintains a reverse bias for the diode PN. When the transistor M is placed in an OFF condition, however, the reverse bias condition will only exist if the voltage $V_D$ applied at the drain is less than the voltage $V_S$ applied at the source, i.e., $V_D$ is less than or equal to $V_+$. As discussed previously (see discussion relating to FIGS. 1A, 1B and 2, above), conventional circuits maintain the reverse bias by connecting the body, not to the source, but always to the highest potential expected to be seen by the drain. This increases the "body effect", however, producing inefficient operation and requiring larger devices. Such drawbacks are avoided in accordance with the invention by the provision of an auxiliary switch $S_1$ which switches the bias voltage of the body to a larger voltage $V_{MAX}$ when the transistor M is placed in the OFF condition. Voltage $V_{MAX}$ is equal to or greater than the largest voltage expected at the drain of transistor M, thereby ensuring that the body diode of M will be reverse biased during the OFF condition. In addition to setting the back gate voltage to $V_{MAX}$, the gate (viz. front gate) voltage $V_G$ is also set to switch to the same voltage $V_{MAX}$ to cause the OFF condition. This ensures that the device M will have no potential $V_B$-$V_G$ across the channel.

Figure 2:
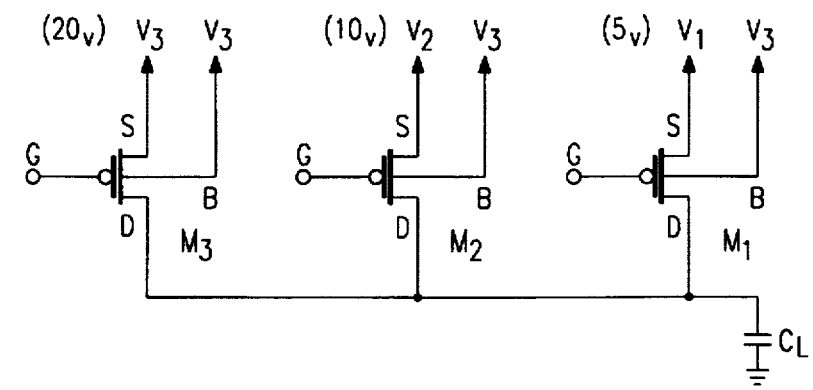
FIG. 2 (prior art) is a schematic view of a conventional MOS device voltage level shifter circuit.
Figure 3B:
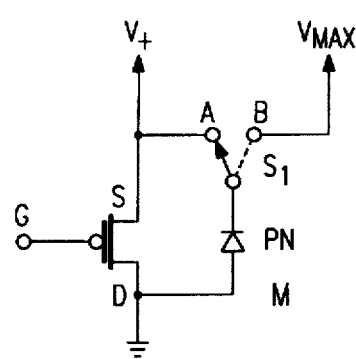
FIG. 3B is a schematic view of an equivalent circuit to the MOS transistor of FIG. 3A.
Figure 4:
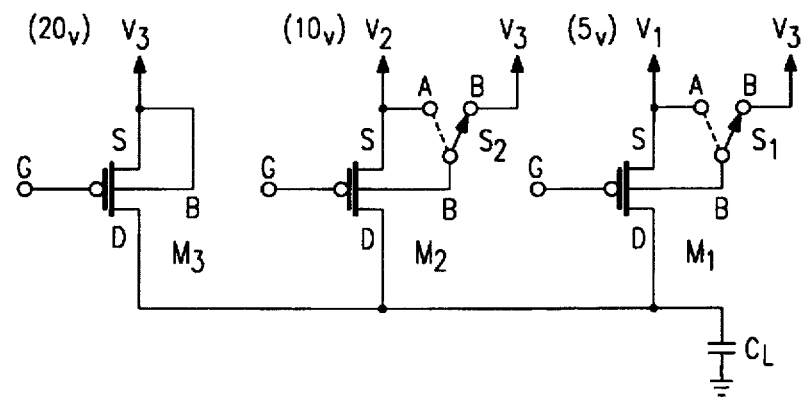
FIG. 4 is a schematic view of a MOS device voltage level shifter circuit in accordance with an embodiment of the invention.

Implementation of the circuit of FIG. 2, utilizing the principles of the invention, is shown in FIG. 4. Here again, a voltage level shifting circuit has a plurality of PMOS transistors $M_1$, $M_2$, $M_3$ connected in parallel for respectively driving a capacitive load $C_L$ with a selected different voltage level $V_1$ (e.g., 5 volts), $V_2$ (e.g., 10 volts), or $V_3$ (e.g., 20 volts). Transistors $M_1$, $M_2$, $M_3$ are controlled so that one of them is placed in the ON condition, with the others in the OFF condition, to connect one of the voltages $V_1$, $V_2$ or $V_3$ to charge the load $C_L$. The largest voltage transistor $M_3$ has its body connected to its source, to achieve efficiency in the customary way. The lower voltage transistors $M_1$, $M_2$, on the other hand, now have their bodies respectively connected to switches $S_1$, $S_2$, which connect the bodies to the sources when the devices are placed in the ON condition and connect the bodies to the highest voltage $V_3$ when the devices are in the OFF condition. The gates of all the devices $M_1$, $M_2$, $M_3$ are connected to apply the ground (0 volts) potential when the device is to be turned ON, and apply the highest voltage $V_3$ when the device is to be turned OFF.

In operation, when transistor $M_3$ is turned ON to apply the highest voltage $V_3$ across capacitive load $C_L$, $M_3$ has its gate at 0 volts and its body at $V_3$; $M_2$ has its gate at $V_3$ and its body at $V_3$ (switch $S_2$ in the "B" position); and $M_1$ has its gate at $V_3$ and its body at $V_3$ (switch $S_1$ in the "B" position). $M_3$ is ON; $M_2$ is OFF; and $M_1$ is OFF; so, the load $C_L$ is charged with the voltage $V_3$. To charge the capacitive load $C_L$ with the voltage $V_2$, $M_3$ is turned OFF with its gate and body at $V_3$; $M_2$ is turned ON with its gate at 0 volts and its body connected to its source by setting the switch $S_1$ to its "A" position; and $M_1$ is left in the OFF position with its gate at $V_3$ and its body at $V_3$. To connect the lowest voltage $V_1$ to load $C_L$, $M_3$ is turned OFF with its gate at $V_3$ and its body at $V_3$; $M_2$ is turned OFF with its gate at $V_3$ and its body at $V_3$ ($S_2$ in the "B" position); and $M_1$ is turned ON with its gate at 0 volts and its body switched to its source ($S_1$ switched to its "A" position). In this way, for their respective ON conditions, the bodies of $M_3$ and $M_2$ are connected to the lower voltages $V_1$ or $V_2$, respectively, so that the MOS structures do not have to be as large. However, when those switches are OFF they are connected to $V_3$, to prevent reverse current flow from the higher voltage $V_2$ or $V_3$, when the higher voltage $V_2$ or $V_3$ is connected to load $C_L$. Thus, each device has its body or back gate switched so that it is either connected to the circuit's highest potential when in the OFF condition, or its most efficient operating point (tied to its source) when in the ON condition. By connecting to the highest potential (i.e., $V_3$) in the OFF condition, there is assurance that the forward bias condition will never be reached.

A specific implementation of the construction of auxiliary switch $S_1$ is shown in FIG. 5. The same construction can be used for switch $S_2$. The terminal marked $V_{IN}$ is connected as the control input $V_G$ to the gate of $M_1$. The source of $M_1$ is connected to the voltage $V_1$, and the drain of $M_1$ is connected through the load $C_L$ to ground. The auxiliary switching circuit $S_1$ (shown within dashed lines) comprises two additional PMOS transistors $M_4$, $M_5$ connected in cascoded configuration between the voltage $V_3$ and the source of $M_1$. $M_4$ is connected with its source connected to $V_3$; its gate connected to the output of an inverter $IV_1$, whose input is connected to the gate of $M_1$; and its body connected to its source. $M_5$ is connected with its source connected to the drain of $M_4$; its gate connected to the gate of $M_1$; its drain connected to the source of $M_1$; and its body connected to the source of $M_4$. The body of $M_1$ is connected to the source of $M_5$.

In operation, when $V_{IN}$ is connected to ground (0 volts), turning $M_1$ ON, $V_3$ will be applied to the gate of $M_4$ (through the inverter $IV_1$) and 0 volts will be applied to the gate of $M_5$, thereby turning $M_4$ OFF and turning $M_5$ ON. This will connect the body of $M_1$ through $M_5$ to the source of $M_1$, allowing efficient operation during the ON condition of transistor $M_1$. On the other hand, when voltage $V_3$ is applied at $V_{IN}$ to turn transistor $M_1$ OFF, the gate of $M_4$ will be connected to ground ($\overline{V}_{IN}=0$ volts) through the inverter $IV_1$ and the gate of $M_5$ will be connected to $V_{IN}=V_3$. This will turn transistor $M_4$ ON and transistor $M_5$ OFF, thereby applying the voltage $V_3$ through transistor $M_4$ to the body of $M_1$. Thus, when $M_1$ is OFF, both its gate and body will be connected to the voltage $V_3$.

The switching of $V_3$ and $V_1$ is all done in $M_4$ and $M_5$. Those transistors are, however, drawing very little current because they serve merely to switch the back gate, not to convey the main current flow to charge load $C_L$. Thus, their relative $R_{DSON}$ resistances or gains are not critical and they can be made very small, relative to the main switching transistors $M_1$, $M_2$ and $M_3$. The inverter $IV_1$ is normally present in a typical cross-coupled type of shifter that might be used to load quiescent current ($V_{IN}$ and $\overline{V}_{IN}$ terminals are both present). Thus, the switching circuits $S_1$ and $S_2$ can be implemented simply by adding two small MOS structures to switch the back gates, with the advantage that the sizes of the $M_1$, $M_2$ devices can be greatly reduced when compared to conventional designs like that of FIG. 3.

Also, switching of the back gates gives better control of ON condition resistances $R_{DSON}$, with consequential better uniformity of resistance. As a consequence, the construction becomes less process dependent because the body effect variance is eliminated.

FIGS. 6-7 show the equivalent implementation for an NMOS embodiment of the same circuit. For the NMOS embodiment, $V_3$ is at the lowest potential (e.g., 0 volts), $V_2$ is at the intermediate potential (e.g., 5 volts) and $V_1$ is at the highest potential (e.g., 10 volts), and the main NMOS transistors $M_1$, $M_2$, $M_3$ are turned ON by a high voltage swing ($V_{IN}>10$ volts) and turned off by a low voltage swing ($V_{IN}=0$ volts). Here, the main channel transistor $M_1$ is an NMOS structure with its source connected to $V_1$, its gate connected to $V_{IN}$ and its drain connected through the load $C_L$ to ground. Transistor $M_4$ is connected to apply the lowest or $V_3$ potential to the body of $M_1$ when $V_{IN}$ is low to turn transistor $M_1$ OFF. Transistor $M_5$ is connected to apply the $M_1$ source or $V_1$ potential to the body of $M_1$ when $V_{IN}$ is high to turn transistor $M_1$ ON.

Those skilled in the art to which the invention relates will appreciate that substitutions and modifications can be made to the described embodiments, without departing from the spirit and scope of the invention as defined by the claims.

What is claimed is:

1. A method for preventing a source-to-body forward bias condition in a MOS transistor, the method comprising:

applying voltage to the gate of the transistor to place the transistor in an ON condition enabling flow of current between the source and drain of the transistor;

connecting the body of the transistor to the transistor source for the ON condition;

applying voltage to the gate of the transistor to place the transistor in an OFF condition preventing flow of current between the source and drain of the transistor; and switching the body of the transistor to a voltage different than the transistor source voltage for the OFF condition; the different voltage acting to place the transistor in a source-to-body reverse bias condition when keeping the transistor body connected to the transistor source would place the transistor in a source-to-body forward bias condition.

2. The method of claim 1, wherein the voltage applied to the transistor gate to place the transistor in the OFF condition is the same as the different voltage.

3. The method of claim 1, wherein the transistor is a PMOS transistor with its source connected to a first reference voltage and its drain connected to ground through a load; and wherein in the OFF condition the transistor drain is switched to a second reference voltage greater than the first reference voltage.

4. The method of claim 3, wherein the different voltage is the same as the second reference voltage.

5. The method of claim 4, wherein the voltage applied to the transistor gate to place the transistor in the OFF condition is the same as the second reference voltage.

6. A method for preventing a forward source-to-body bias condition in a MOS transistor in a circuit having a plurality of MOS transistors connected in parallel and respectively to a corresponding plurality of reference voltages, the method comprising:

applying voltage to the gate of a first one of the transistors to place the first transistor in an ON condition enabling flow of current between the source and drain of the first transistor to apply a first one of the reference voltages to a load;

connecting the body of the first transistor to the first transistor source for the ON condition;

applying voltage to the gate of the first transistor to place the first transistor in an OFF condition preventing flow of current between the source and drain of the first transistor;

applying voltage to the gate of a second one of the transistors to place the second transistor in an ON condition enabling flow of current between the source and drain of the second transistor to apply a second one of the reference voltages to the load and to the drain of the first transistor; and switching the body of the first transistor to a voltage different than the first reference voltage for the second transistor ON condition; the different voltage acting to place the first transistor in the reverse bias condition when keeping the first transistor body connected to the first transistor source would place the first transistor in a source-to-body forward bias condition.

7. A voltage level shifting circuit, comprising:

a plurality of MOS transistors connected in parallel to act as main switches for selective connection of respective different reference voltage sources to a capacitive load;

auxiliary switches provided to connect the body of each main switch, either to its source when that main switch is in the ON condition or to the highest one of the reference voltage sources when that main switch is in the OFF condition.

\* \* \* \* \*